United States Patent [19]

Barou

[11] Patent Number: 5,004,970
[45] Date of Patent: Apr. 2, 1991

[54] DEVICE AND A PROCESS FOR DETECTING CURRENT FLOW IN A MOS TRANSISTOR

[75] Inventor: Michel Barou, Voreppe, France

[73] Assignee: SGS-Thomson Microelectronics S.A., Gentilly, France

[21] Appl. No.: 467,459

[22] Filed: Jan. 19, 1990

[30] Foreign Application Priority Data

Jan. 20, 1989 [FR] France .................. 89 01230

[51] Int. Cl.⁵ .................................. G05F 1/573
[52] U.S. Cl. ............................ 323/277; 323/279; 361/91
[58] Field of Search ............... 323/274, 275, 276, 277, 323/278, 279; 361/18, 86, 87, 88, 90, 91

[56] References Cited

U.S. PATENT DOCUMENTS

| | | | |
|---|---|---|---|
| 3,939,399 | 2/1976 | Funatsu et al. | 323/275 |
| 4,021,701 | 5/1977 | Davies | 361/18 |
| 4,319,181 | 3/1982 | Wrathall | 323/315 |
| 4,599,554 | 7/1986 | Jaycox et al. | 323/317 |
| 4,703,390 | 10/1987 | Fay et al. | 323/277 |
| 4,704,572 | 11/1987 | Melbert | 323/279 |
| 4,750,079 | 6/1988 | Fay et al. | 323/277 |

*Primary Examiner*—Peter S. Wong
*Attorney, Agent, or Firm*—Lowe, Price, LeBlanc, Becker & Shur

[57] ABSTRACT

In a device for detecting the flow of a current lower than a given threshold current in a load (L) in series with a power MOS transistor (M1), the free terminal of the MOS transistor is connected to a first terminal (1) of a supply source, the second terminal (2) of which is connected to the free terminal of the load (L), the gate (G1) of the MOS transistor being connected to a control source (3). A means (11) for detecting the voltage drop is connected across the terminals of the MOS transistor and a control loop (12) imposes an appropriate gate voltage to the MOS transistor as soon as the voltage drop across its terminals tends to decrease below a determined level.

5 Claims, 2 Drawing Sheets

DEVICE AND A PROCESS FOR DETECTING CURRENT FLOW IN A MOS TRANSISTOR

BACKGROUND OF THE INVENTION

The present invention relates to the field of power MOS transistors.

Conventionally, a power MOS transistor is often manufactured according to the so-called DMOS (Diffused MOS) technology and is comprised of a set of n1 identical cells which, due to recurrence, allow the DMOS transistor to stand high power. The value of n1 is for example 2500. This MOS transistor is usually designed to be serially connected to a load.

FIG. 1 shows a power MOS transistor M1 serially connected, through its source S1, to a load L. The transistor drain D1 is connected to a first terminal 1 of a supply source. The free terminal of load L is connected to the second terminal 2 of the supply source. Usually, a positive voltage VCC is applied to terminal 1, terminal 2 being grounded. Transistor M1 is rendered conductive if a control voltage VH higher than voltage VCC is applied on its gate G1 by a control source 3.

The load may get interrupted while the transistor is in the conductive state. The load can be considered as being interrupted when the current that flows therethrough becomes lower than a threshold current IA, the value of which is for example IA=3 mA. When the current flowing through transistor M1 drops to a value lower than the threshold current, the voltage drop VDB between the drain and source of this transistor decreases and becomes lower than 1 mV.

A way for determining such a load interruption could consist in measuring the voltage drop VDS. For this purpose, one usually uses a circuit comprising an auxiliary MOS transistor M2, comprised for example of n2=50 cells identical to the n1 cells constituting the power transistor, connected through its drain D2 to a resistor R, the free terminal of which is connected to terminal 1 of the supply source. The source S2 of transistor M2 is directly connected to the source S1 of transistor M1. The gate G2 of transistor M2 is directly connected to the gate G1 of transistor M1.

An operational amplifier A1 compares the voltage drop across the terminals of resistor R with a reference value VX. If IL is the current in load L, $I_{M1}$ is the current in transistor M1, $I_{M2}$ is the current in transistor M2, and $R_{ON1}$ and $R_{ON2}$ are the resistances in the linear state of transistors M1 and M2, respectively, the voltage drop $V_R$ across the terminals of resistor R will be:

$$V_R = R\, I_{M2} \quad (1)$$

$$V_R = R\, IL \frac{R_{ON1}}{R_{ON1} + R_{ON2} + R} \# R_{ON1}\, IL$$

Indeed, $R_{ON1}$ and $R_{ON2}$ always have low values with respect to R.

The value of $R_{ON1}$ is conventionally of about a few tenths ohm, for example 0.3 ohm. Voltage $V_R$ is the voltage that is compared with a reference voltage. In practice, one does not know how to easily associate comparators and reference voltages wherein the value of the reference voltage is lower than a few tens millivolts, for example 30 millivolts.

Thus, it is deducted from relation (1) that it will not be possible to determine the current IL for a value lower than 30 mV/0.3 ohm=100 mA.

However, it is desired to detect currents of about 3 mA flowing through the load.

SUMMARY OF THE INVENTION

The invention provides for a device permitting detection of currents associated with load interruptions and an associated detection process.

More particularly, the invention provides for a device for detecting a current flow lower than a given threshold current in a load in series with a power MOS transistor, the free terminal of the MOS transistor being connected to a first terminal of a supply source, the second terminal of which is connected to the free terminal of the load, the gate of the MOS transistor being connected to a control source. A voltage drop detecting means is connected across the terminals of the MOS transistor and a control loop imposes an appropriate gate voltage to the MOS transistor as soon as the voltage drop across its terminals tends to decrease below a determined level.

According to another aspect of the invention, there is provided a process for detecting the flow of a current lower than a given threshold current in a load in series with a power MOS transistor fed by a determined voltage. The process consists of comparing the voltage across the terminals of the MOS transistor with a reference voltage and causing the voltage on the MOS transistor gate to decrease as soon as the voltage across the transistor terminals drops below the reference voltage, whereby the current in the MOS transistor remains detectable and the MOS transistor always operates in its saturation region

BRIEF DISCLOSURE OF THE DRAWINGS

The foregoing and other objects, features and advantages of the invention will be apparent from the following detailed description of a preferred embodiment as illustrated in the accompanying drawings wherein:

FIG. 1, already described, shows the electric diagram of a current detection device according to the prior art;

DETAILED DESCRIPTION OF THE INVENTION

Figure 1:
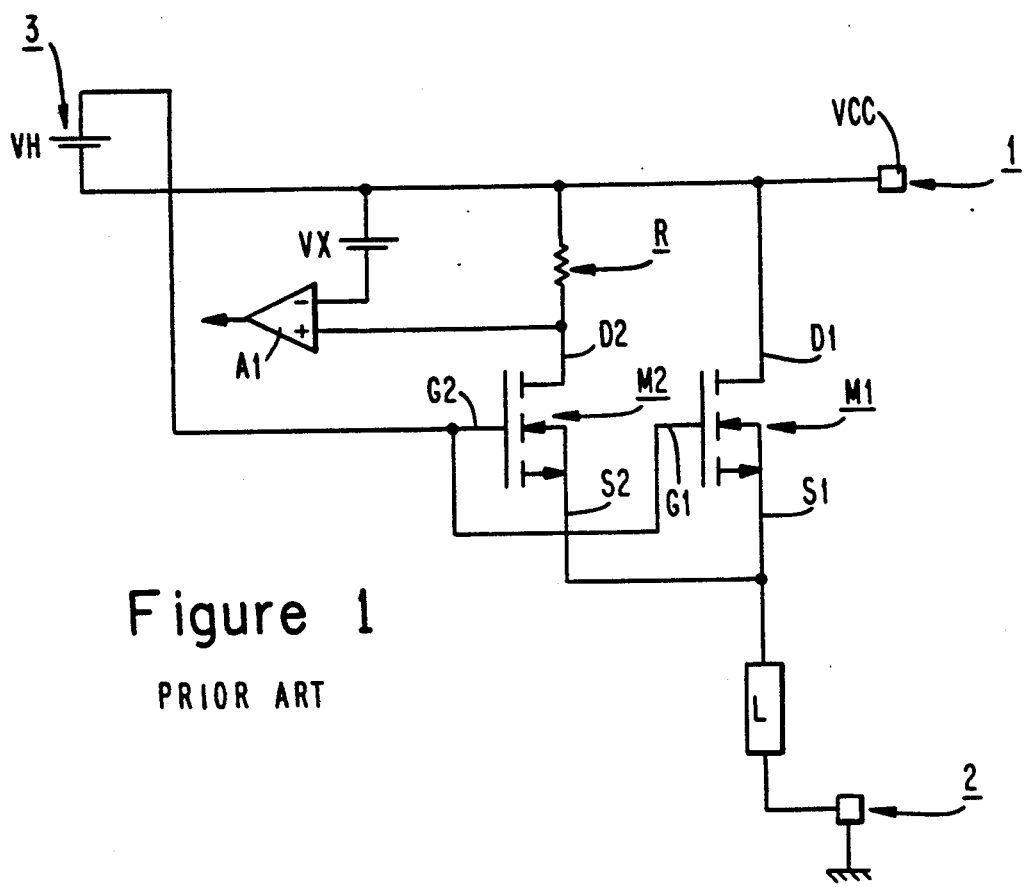
Figure 2:
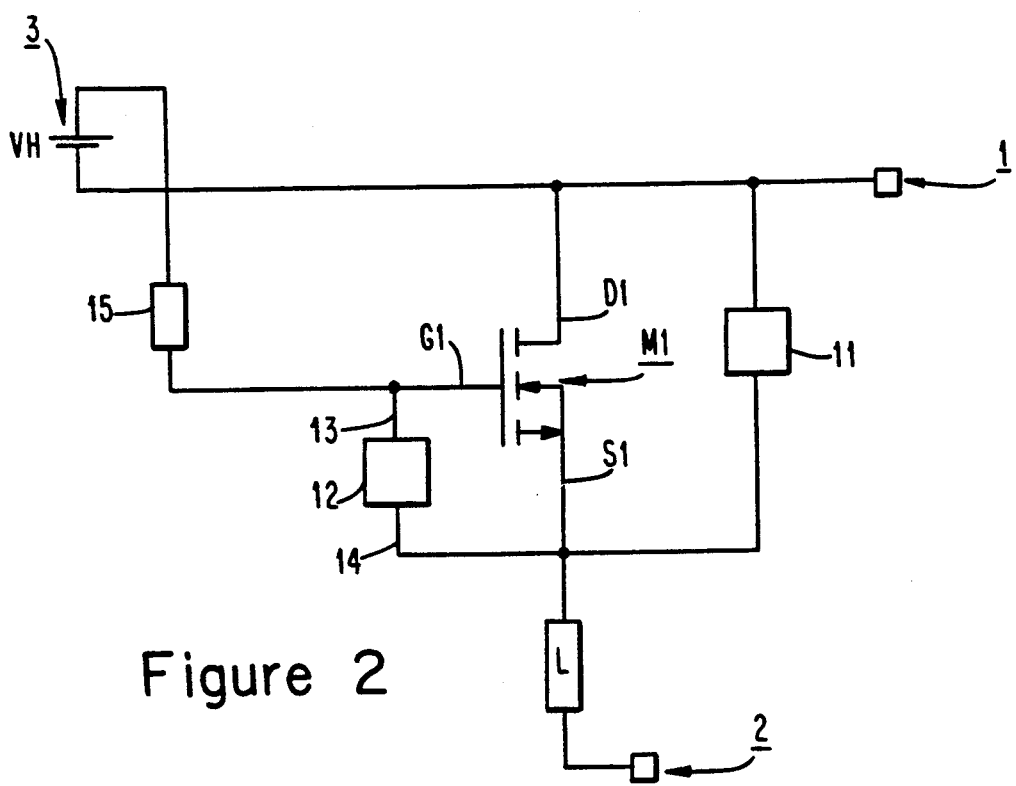
FIG. 2 shows a current detection device according to the invention.

FIG. 2 shows a device for detecting the flow of a current IL through a load L in series with a power MOS transistor M1. As in the case of FIG. 1, the free terminal of transistor M1 is connected to a first terminal 1 of a supply source and the free terminal of load L is connected to the second terminal 2 of the supply source. A control source S, connected to gate G1 of transistor M1, supplies to this gate G1 a control voltage VH. A means for detecting the voltage drop across transistor M1 (this means being represented by block 11) is connected between the drain D1 and source S1 of transistor M1.

In comparison with FIG. 1 the device further comprises a control loop represented by block 12, a first terminal 13 of which is connected to the gate G1 of transistor M1 and a second terminal 14 is connected to the source S1 of this transistor. A component 15, constituted for example by a current source, is connected between the control source 3 and the gate G1 of transistor M1 so as to cause the voltage applied on this gate G1 to vary so that the voltage drop across the terminals of the MOS transistor always remains higher than a determined value.

Figure 3:
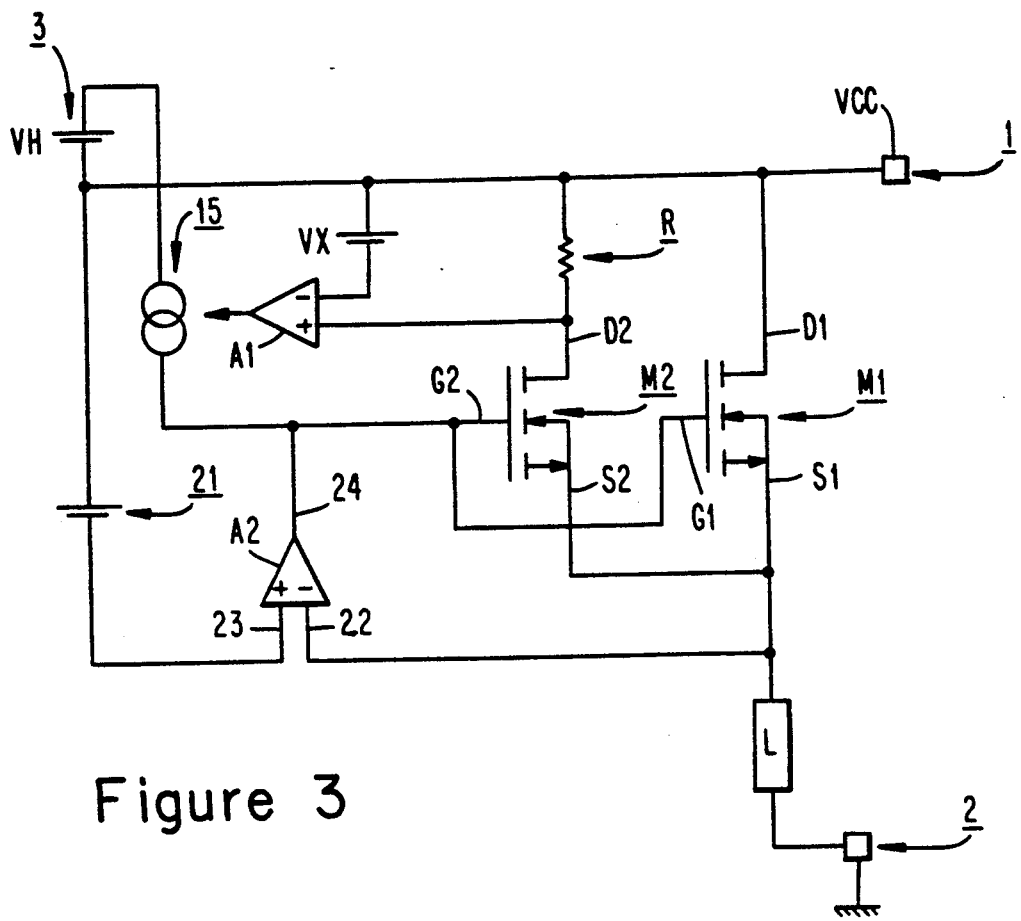
FIG. 3 shows an embodiment of the current detection device according to the invention.

FIG. 3 shows an embodiment of the current detection device according to the invention. The means for detecting the voltage drop across the terminals of transistor M1 (represented in FIG. 2 by block 11) is comprised of an auxiliary MOS transistor M2 having n2 cells, a resistor R, an operational amplifier A1 and a diagnostic or reference voltage source VX arranged in the way shown in FIG. 1. A positive voltage VCC is applied to terminal 1 of the supply source, terminal 2 being grounded. Component 15 of FIG. 2 is a current source (an impedance).

The control loop, represented in FIG. 2 by block 12, is comprised of an operational amplifier A2 and a reference voltage source 21. The operational amplifier A2 comprises a first input 22 connected to the source S1 of transistor M1 and a second input 23 connected to a first terminal of the reference voltage source 21. The second terminal of this source 21 is connected to the drain D1 of transistor M1 and supplies a positive reference voltage VK. Output 24 of the operational amplifier A2 is connected to the gates G1 and G2 of transistors M1 and M2, respectively.

Figure 4:
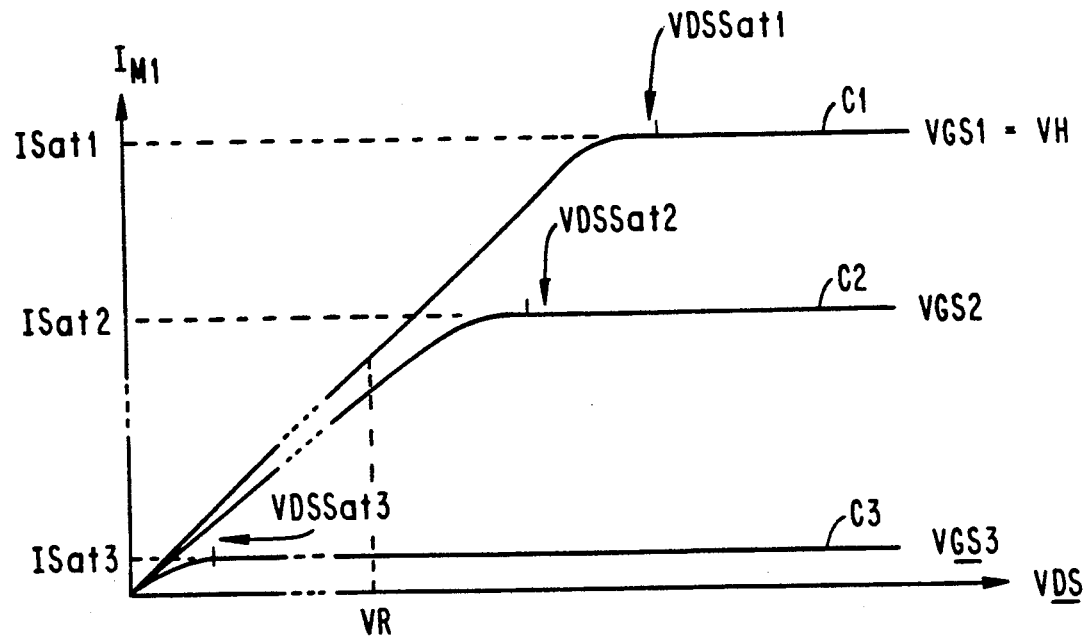
FIG. 4 shows current curves for a MOS transistor as a function of the voltage across its terminals for various gate voltages.

FIG. 4 shows, in curves C1-C3, the current $I_{M1}$ between the drain and source of transistor M1 as a function of voltage VDS between the drain and source of this transistor. Each of the curves C1-C3 corresponds to a gate voltage, VGS1-VGS3, respectively. Voltage VGS1 is equal to the control voltage VH.

Each curve is divided into two regions: a saturation region wherein voltage VDB is higher than a saturation voltage VDSSat and wherein current $I_{M1}$ is equal to a constant saturation current ISat, and a substantially linear region wherein voltage VDS is lower than the saturation voltage VDSSat and wherein current $I_{M1}$ is substantially proportional to voltage VDS. While VGS decreases, ISat and VDSSat decrease. Currents ISat1, Sat2 and ISat3, as well as voltages VDSSat1, VDSSat2 and VDSSat3, are associated with curves C1, C2 and C3, respectively.

When current IL decreases in the load, voltage VDS decreases and becomes lower than voltage VDSSat1. As long as VDS is higher than the reference voltage VK, the intensity of current $I_{M1}$ decreases on curve C1.

When voltage VDS tends to become lower than voltage VK, the operational amplifier A2, which tends to maintain its inputs 22 and 23 at the same voltage, becomes conductive for maintaining voltage VDS across the terminals of transistor M1 equal to voltage VK. To achieve this purpose, that is, to maintain a substantially high voltage VDS while current $I_{M1}$ tends to decrease, the operational amplifier A2 causes voltage VGS on gates G1 and G2 to drop to a voltage such as voltage VGS3 corresponding to curve C3 of FIG. 4. The saturation voltage VDSSat is then equal to voltage VDSSat3.

The reference voltage VK is for example equal to 150 mV. During load interruptions, the saturation voltages decrease down to voltage values VDSSat3 of about 50 mV, substantially lower than VK. Thus, transistor M1 operates in saturation state. Current $I_{M1}$ which flows through the transistor is equal to the saturation current ISat3.

Without control loop, transistors M1 and M2 were set in linear state when the current in the load dropped.

With control loop, since transistors M1 and M2 operate in saturation state due to the drop of current IL, currents $I_{M1}$ and $I_{M2}$ are linked by the relation $I_{M1}=(n1/n2)I_{M2}$. Thus, since $IL=I_{M1}+I_{M2}$, one obtains:

$$IL=(n1/n2)I_{M2}+I_{M2},$$

that is $$IL=[(n1/n2)+1]I_{M2}.$$

Current $I_{M2}$ is associated to voltage $V_R$ across the terminals of resistor R by the relation $I_{M2}=V_R/R$. Current IL is thus given by $$IL = \frac{[(n1/n2) + 1]}{R} V_R.$$

Considering the values R=500 ohms and n1/n2=2500/50, that is, n1/n2=50, and taking the value 30 mV as a diagnostic voltage value above which proper associations of comparators and diagnostic voltages are realized, it will be possible to detect the current flows IL down to a value of (50+1)30 mV/500 ohms #3 mA corresponding to the value of the threshold current IA.

The invention is capable of numerous implementation variants which will clearly appear to those skilled in the art. For example, the transistor M2, resistor R, operational amplifier Al and diagnostic voltage source VX could be replaced by any means able to detect voltage drop across the terminals of transistor M1.

I claim:

1. A device for detecting the flow of current lower than a given threshold current in a load, wherein the load is series connected through the source and drain terminals of a MOS transistor to a supply source, and the gate of the MOS transistor is connected to a control source, said device comprising:
   means for detecting a voltage drop across the source and drain terminals of the MOS transistor; and
   a control loop for imposing an appropriate gate voltage to the MOS transistor as soon as the voltage drop across said source and drain terminals tends to decrease below a predetermined level.

2. A detection device according to claim 1 wherein the means for detecting the voltage drop across the source and drain terminals of the power MOS transistor comprises:
   an auxiliary MOS transistor, the source of which is connected to the source of the power MOS transistor and the gate of which is connected to the gate of the power MOS transistor;
   a resistor, a first terminal of which is connected to the drain of the auxiliary MOS transistor and the second terminal is connected to the first supply source terminal; and
   an operational amplifier connected to compare the voltage across said resistor to a reference voltage.

3. A device for detecting the flow of current lower than a given threshold current in a load, wherein the load is series connected through the source and drain terminals of a MOS transistor to a supply source, and the gate of the MOS transistor is connected to a control source, said device comprising:
- means for detecting a voltage drop across the source and drain terminals of the MOS transistor; and
- a control loop, comprising an operational amplifier and a reference voltage source, for imposing an appropriate gate voltage to the MOS transistor as soon as the voltage drop across said source and drain terminals tends to decrease below a predetermined level; wherein
  - the operational amplifier has a first input connected to the source of the MOS transistor and a second input connected to a negative terminal of the reference voltage source,
  - the positive terminal of the reference voltage source is connected to the drain (D1) of the MOS transistor,
  - an output of the operational amplifier is connected to the gate of the MOS transistor,
- said device further comprising a current source connected between the output of the operational amplifier and said control source for allowing the current to be used in the operational amplifier in order to decrease the gate voltage of the MOS transistor.

4. A method for detecting the flow of a current lower than the threshold current in a load in series with a power MOS transistor fed by a supply voltage, comprising the steps of:
- comparing the voltage across the source and drain terminals of the MOS transistor with a reference voltage; and
- causing the voltage on the MOS transistor gate to decrease as soon as said voltage across said source and drain terminals drops below the reference voltage, whereby the current through the load remains detectable and the MOS transistor always operates in its saturation region.

5. A detection method according to claim 4 wherein the reference voltage is equal to 150 mV.

* * * * *